(12) United States Patent
Morris

(10) Patent No.: US 8,252,642 B2
(45) Date of Patent: Aug. 28, 2012

(54) FABRICATION METHODS FOR RADIATION HARDENED ISOLATION STRUCTURES

(75) Inventor: Wesley H. Morris, Austin, TX (US)

(73) Assignee: Silicon Space Technology Corp., Austin, TX (US)

( * ) Notice: Subject to any disclaimer, the term of this patent is extended or adjusted under 35 U.S.C. 154(b) by 141 days.

(21) Appl. No.: 12/627,784

(22) Filed: Nov. 30, 2009

(65) Prior Publication Data
US 2010/0267212 A1 Oct. 21, 2010

Related U.S. Application Data

(62) Division of application No. 11/581,561, filed on Oct. 16, 2006.

(60) Provisional application No. 60/727,031, filed on Oct. 14, 2005.

(51) Int. Cl.
*H01L 21/8238* (2006.01)

(52) U.S. Cl. ........ 438/224; 438/228; 438/527; 438/533; 257/E29.064

(58) Field of Classification Search .................. 257/371, 257/372, 376, 409, 921, E29.063, E29.064; 438/223, 224, 226, 227, 228, 514, 526, 527, 438/533
See application file for complete search history.

(56) References Cited

U.S. PATENT DOCUMENTS

| | | | |
|---|---|---|---|
| 4,054,894 A | 10/1977 | Heagerty et al. | |
| 4,161,417 A | 7/1979 | Yim et al. | |
| 4,639,761 A | 1/1987 | Singer et al. | |
| 4,980,747 A | 12/1990 | Hutter et al. | |
| 5,138,420 A | * 8/1992 | Komori et al. | 257/371 |
| 5,220,192 A | 6/1993 | Owens et al. | |
| 5,304,833 A | 4/1994 | Shigeki et al. | |
| 5,376,816 A | 12/1994 | Nishigori et al. | |
| 5,386,136 A | 1/1995 | Williams et al. | |
| H1435 H | 5/1995 | Cherne et al. | |
| 5,446,305 A | 8/1995 | Komori et al. | |
| 5,501,993 A | 3/1996 | Borland | |
| 5,641,982 A | 6/1997 | Takahashi | |
| 5,719,733 A | 2/1998 | Wei et al. | |
| 5,728,612 A | 3/1998 | Wei et al. | |
| 5,821,572 A | 10/1998 | Walker et al. | |
| 5,835,986 A | 11/1998 | Wei et al. | |
| 5,843,813 A | 12/1998 | Wei et al. | |

(Continued)

FOREIGN PATENT DOCUMENTS

EP   0057126 A2   8/1982

(Continued)

OTHER PUBLICATIONS

Final Office Action mailed Jul. 7, 2010 in U.S. Appl. No. 11/486,347, 7 pages.

(Continued)

*Primary Examiner* — Matthew E Warren
(74) *Attorney, Agent, or Firm* — Zagorin O'Brien Graham LLP

(57) ABSTRACT

Semiconductor devices can be fabricated using conventional designs and process but including specialized structures to reduce or eliminate detrimental effects caused by various forms of radiation. Such semiconductor devices can include one or more parasitic isolation devices and/or buried layer structures disclosed in the present application. The introduction of design and/or process steps to accommodate these novel structures is compatible with conventional CMOS fabrication processes, and can therefore be accomplished at relatively low cost and with relative simplicity.

16 Claims, 10 Drawing Sheets

U.S. PATENT DOCUMENTS

| | | | |
|---|---|---|---|
| 5,858,828 | A | 1/1999 | Seliskar et al. |
| 5,880,515 | A | 3/1999 | Bartlett |
| 5,894,153 | A | 4/1999 | Walker et al. |
| 5,904,551 | A | 5/1999 | Aronowitz et al. |
| 5,963,801 | A | 10/1999 | Aronowitz et al. |
| 5,966,599 | A | 10/1999 | Walker et al. |
| 5,985,705 | A | 11/1999 | Seliskar |
| 6,057,588 | A | 5/2000 | Yamazaki |
| 6,063,672 | A | 5/2000 | Miller et al. |
| 6,069,048 | A | 5/2000 | Daniel |
| 6,136,672 | A | 10/2000 | Bourdelle et al. |
| 6,137,142 | A | 10/2000 | Burr |
| 6,144,076 | A | 11/2000 | Puchner et al. |
| 6,165,821 | A | 12/2000 | Boden, Jr. et al. |
| 6,171,967 | B1 | 1/2001 | Jun |
| 6,309,940 | B1 | 10/2001 | Lee |
| 6,316,817 | B1 | 11/2001 | Seliskar et al. |
| 6,319,793 | B1 | 11/2001 | Bartlett et al. |
| 6,333,520 | B1 | 12/2001 | Inoue |
| 6,348,718 | B1 | 2/2002 | Leipold et al. |
| 6,395,611 | B1 | 5/2002 | Belk et al. |
| 6,462,378 | B1 | 10/2002 | Kim |
| 6,472,715 | B1 | 10/2002 | Liu et al. |
| 6,476,451 | B2 | 11/2002 | Wong |
| 6,492,270 | B1 | 12/2002 | Lou |
| 6,501,155 | B2 | 12/2002 | Okawa |
| 6,514,824 | B1 | 2/2003 | Ranazzo et al. |
| 6,525,377 | B1 | 2/2003 | Seliskar |
| 6,664,608 | B1 | 12/2003 | Burr |
| 6,673,635 | B1 | 1/2004 | Hellig et al. |
| 6,706,583 | B1 | 3/2004 | Comard |
| 6,787,858 | B2 | 9/2004 | Zitouni et al. |
| 6,847,065 | B1 | 1/2005 | Lum |
| 6,864,152 | B1 | 3/2005 | Mirbedini et al. |
| 6,885,078 | B2 | 4/2005 | Bartlett et al. |
| 6,940,170 | B2 | 9/2005 | Parikh |
| 7,304,354 | B2 | 12/2007 | Morris |
| 7,629,654 | B2 | 12/2009 | Morris |
| 2001/0048135 | A1* | 12/2001 | Leipold .......................... 257/369 |
| 2002/0182884 | A1 | 12/2002 | Bernkopf et al. |
| 2003/0077875 | A1 | 4/2003 | Mandelman et al. |
| 2004/0075144 | A1 | 4/2004 | Zitouni et al. |
| 2004/0106291 | A1 | 6/2004 | Ho et al. |
| 2005/0269601 | A1 | 12/2005 | Tsubaki |
| 2006/0249759 | A1 | 11/2006 | Morris |
| 2007/0141794 | A1 | 6/2007 | Morris |
| 2008/0073725 | A1 | 3/2008 | Morris |
| 2008/0142899 | A1 | 6/2008 | Morris |
| 2008/0188045 | A1 | 8/2008 | Morris |

FOREIGN PATENT DOCUMENTS

| | | |
|---|---|---|
| GB | 2314973 A | 1/1998 |
| JP | 57-143843 A | 9/1982 |
| JP | 1986240671 | 10/1986 |
| JP | 62-250671 A | 10/1987 |
| JP | 01-265555 A | 10/1989 |
| JP | 1989273346 | 11/1989 |
| JP | 04-003920 A | 1/1991 |
| JP | 04-139758 A | 5/1992 |
| JP | 2000-049237 A | 2/2000 |
| JP | 2002-158293 A | 5/2002 |
| WO | WO9425988 | 11/1994 |
| WO | 2005079400 A2 | 9/2005 |

OTHER PUBLICATIONS

Extended European Search Report, mailed Jul. 21, 2010 in EP App. No. 06825965.4, 7 pages.

Bashir, Rashid et al., "A Complementary Bipolar Technology Family With A Vertically Integrated PNP for High-Frequency Analog Application," IEEE Transactions of Electron Devices, vol. 48, No. 11, Nov. 2001, © 2001 by IEEE, pp. 2525-2534.

Benedetto, Joseph M., "Economy-Class Ion-Defying ICs in Orbit," reprinted from IEEE Spectrum, vol. 35, No. 3, Mar. 1998, 6 pages.

Bourdelle et al., "Evaluation of High Dose, High Energy Boron Implantation into Cz Substrates for Epi-Replacement in CMOS Technology," IEEE Transactions on Electron Devices, vol. 48, No. 9, Sep. 2001, © 2001 IEEE pp. 2043-2049.

Bourdelle, et al., "Epi-Replacement in CMOS Technology by High Dose, High Energy Boron Implantation into Cz Substrates," Conference on Ion Implantation Technology; Alpbach, Austria; Sep. 2000, © 2000 IEEE; pp. 312-315.

Frei, M.R., et al., "Integration of High-Q Inductors in a Latch-Up Resistant CMOS Technology," Proceedings of the International Electron Devices Meeting, Dec. 1999, pp. 757-760.

Harame, D.L., et al., Design Automation Methodology and rf/analog Modeling for rf CMOS and SiGe BiCMOS Technologies, IBM J. Res. & Dev., vol. 47, No. 2/3, Mar./May 2003, © 2003 by IBM, pp. 139-175.

International Search Report for International Application No. PCT/US2006/040224, mailed Dec. 3, 2007, 3 pages.

International Search Report for International Application No. PCT/US2007/75228, mailed Jan. 29, 2008, 3 pages.

Jordan, Anthony, "*Rad Hard, Space Ready*, Case Study: Evolution of A Fab-Independent Radiation-Hardened COTS IC Supplier," Reprinted from COTS Journal, Nov. 2001, 5 pages.

Leong, K.C., et al., "Super Latch-up Resistance of High Dose, High Energy Implanted p+ Buried Layers," 1998 International Conference on Ion Implantation Technology Proceedings; vol. 1; Kyoto, Japan; © 1999 IEEE; pp. 99-101.

Morris, et al., "Buried Layer/Connecting Layer High Energy Implantation for Improved CMOS Latch-up," 1996 Proceedings of the 11th International Conference on Ion Implantation Technology; Austin, Texas; © 1997 IEEE; pp. 796-799.

Morris, Wesley, "Latchup in CMOS," IEEE 03CH37400, 41st Annual International Reliability Physics Symposium, Dallas, Texas, 2003, © 2003 by IEEE, pp. 76-84.

Morris. W., et al., "Technical and Economic Considerations for Retrograde Well and Channel Implants," Proceedings of IEEE Conference on Ion Implantation Technology, Sep. 17-22, 2000, pp. 73-76.

Pech et al., "Extended Defects in Silicon by MeV B++ Implantation in Different 8" Cz-Si Wafers," 1998 International Conference on Ion Implantation Technology Proceedings; vol. 2; Kyoto, Japan; © 1999 IEEE; pp. 756-759.

Puchner, H. et al., "N-Well Engineering to Improve Soft-Error-Rate Immunity for P-Type Substrate SRAM Technologies," 2001 ESDERC Conference, Dresden, Germany, Sep. 10-14, 2001, 4 pages.

Rubin et al., "Effective Gettering of Oxygen by High Dose, High Energy Boron Buried Layers," 1998 International Conference on Ion Implantation Technology Proceedings; vol. 2; Kyoto, Japan; © 1999 IEEE; pp. 1010-1013.

Rubin et al., "Process Architectures Using MeV Implanted Blanket Buried Layers for Latch-Up Imrovements on Bulk Silicon," 1996 Proceedings of the 11th International Conference on Ion Implantation Technology; Austin, Texas; © 1997 IEEE; pp. 13-16.

Rubin, L.M., et al., "Process Control Issues for Retrogade Well Implants for Narrow n+/p+ Isolation in CMOS," Proceedings of the 14th International Conference on Ion Implantation Technology, Sep. 22-27, 2002, pp. 17-20.

Van Zant, Peter, Microchip Fabrication: A Practical Guide to Semiconductor Processing, McGraw-Hill, 2000, Ch. 3: pp. 62-63; Ch. 13: pp. 396-397, 402-403, and 406-407 (best available copy).

Voldman, S. et al., "The Influence of Heavily Doped Buried Layer Implants on Electrostatic Discharge (ESD), Latchup, and A Silicon Germanium Heterojunction Bipolar Transistor in A BiCMOS SiGe Technology," 42nd Annual Reliability Physics Symposium Proceedings, 2004, Publication Date: Apr. 25-29, 2004, IEEE International, pp. 143-151.

Wolf, S. and Tauber, R.N., "Silicon Processing for the VLSI Era, vol. 1: Process Technology", Published by Lattice Press in 2000, pp. 256-259; 406 and 407.

Ziegler, J.F., et al., "IBM Experiments in Soft Fails in Computer Electronics (1978-1994)," IBM J. Res. Develop., vol. 40, No. 1, Jan. 1996, © 1996 by IBM, pp. 3-18.

Ziegler, James F., and Puchner, Helmut, *SER—History, Trends and Challenges*, Cypress Semiconductor Corporation, 2004, Ch. 6, "Process Techniques to Improve SER Immunity," pp. 6-3 to 6-16 and Ch. 8, "Modeling SER from Alpha Particles," pp. 8-3 to 8-13.

Non-Final Office Action mailed Jun. 25, 2009 for U.S. Appl. No. 11/949,654, 5 pages.

Final Office Action mailed May 29, 2009 for U.S. Appl. No. 11/581,561, 11 pages.

Non-Final Office Action mailed Aug. 27, 2008 for U.S. Appl. No. 11/581,561, 10 pages.

Non-Final Office Action mailed Sep. 22, 2005 for U.S. Appl. No. 10/951,283, 15 pages.

Final Office Action mailed Jun. 9, 2006 for U.S. Appl. No. 10/951,283, 16 pages.

Non-Final Office Action mailed Feb. 7, 2007 for U.S. Appl. No. 10/951,283, 10 pages.

Final Office Action mailed Sep. 20, 2007 for U.S. Appl. No. 10/951,283, 6 pages.

Non-Final Office Action mailed Oct. 5, 2009 for U.S. Appl. No. 11/486,347, 11 pages.

Notice of Allowance mailed Oct. 6, 2009 for U.S. Appl. No. 11/949,654, 6 pages.

Office Action mailed Aug. 3, 2010 in Japanese App. No. 2008-535745, 4 pages.

* cited by examiner

FABRICATION METHODS FOR RADIATION HARDENED ISOLATION STRUCTURES

CROSS-REFERENCE TO RELATED APPLICATION(S)

This application is a divisional application of U.S. application Ser. No. 11/581,561, filed Oct. 16, 2006, entitled "Radiation Hardened Isolation Structures and Fabrication Methods," naming Wesley H. Morris as the inventor, which application claims the benefit under 35 U.S.C. §119(e) of U.S. Provisional Application No. 60/727,031, filed Oct. 14, 2005, entitled "Buried Guard Ring And Radiation Hardened Isolation Structures And Fabrication Methods," and naming Wesley H. Morris as the inventor. The above-referenced applications are hereby incorporated by reference herein in their entirety.

BACKGROUND

1. Technical Field

The present invention relates to integrated circuits, and particularly to integrated circuits with partial and/or complete immunity to failure modes associated with radiation exposure.

2. Description of the Related Art

The high radiation environments, including the upper atmosphere, near-earth orbit, outer space, and certain terrestrial environments (e.g., proximity to devices producing significant amounts of radiation) provide the most hostile environments for reliable operation of microelectronic solid-state devices. Exposure to radiation causes electrical degradation of both transistors and circuit-isolation elements, which can lead to sporadic device behavior and/or complete destructive failure of integrated circuits (ICs). Because of the complexities of designing and fabricating integrated circuits tolerant of radiation environments, during the 1980s a number of large commercial semiconductor companies began to specialize in the production of radiation-hardened ICs, primarily for military and aerospace systems.

At the same time, the high manufacturing costs of non-radiation-hardened commercial ICs has generally been offset by progress in high volume production, growing from less than $40B to more than $200B in 2004. To remain competitive, commercial IC manufacturers have deployed new state-of-the art silicon IC manufacturing facilities every 3-5 years.

The more limited low-volume demand for radiation-hardened ICs cannot justify the expense of dedicated leading-edge manufacturing facilities, despite the very attractive margins in the military and aerospace electronics market. These financial constraints have severely limited the ability of radiation-hardened IC suppliers to utilize leading-edge IC manufacturing technology. Consequently, the number of companies producing radiation-hardened IC components has been dramatically reduced, and their capabilities have fallen far behind those of the commercial sector.

During the 1990s, the combination of rising costs for new IC manufacturing facilities, military budget reductions, and a dwindling number of suppliers widened the technological disparity between commercial and radiation-hardened microelectronics. Commercial and military satellite manufacturers attempting to bridge this gap were forced to employ a new concept called "COTS" (commercial off-the-shelf) to procure the high-performance ICs required for building their electronic platforms.

The COTS approach uses extensive laboratory testing of commodity (unhardened) commercial ICs to screen and "qualify" them for applications where they are likely to be exposed to damaging radiation. COTS was considered the only practical solution to obtain space-qualified high-performance ICs. Despite greatly diluted radiation standards, qualified product could not reliably be found using COTS. Therefore, those few nominally acceptable ICs typically offered no significant cost savings. Satellites manufactured using COTS ICs have suffered significant reductions in capability and mission lifetime due to destructive radiation exposure. The advancing miniaturization of CMOS technology increases sensitivity to certain forms of radiation, further widening the gap between COTS capabilities and space electronics market requirements. After more than ten years of system failures, the COTS approach has failed to provide a viable solution for the supply of radiation-hardened ICs.

Accordingly, it is desirable to bring high-performance and cost-effective radiation-hardened integrated circuits (RHICs) to military, aerospace, and certain terrestrial electronics markets using the readily accessible leading-edge infrastructure of high-volume commercial microelectronics manufacturers. More specifically, it is further desirable to systematically address at the silicon process level each of the degradation mechanisms caused by radiation and to thereby develop new radiation hardened solutions that can be integrated into commercial microelectronic fabrication processes without impacting significantly the commercial baseline electrical spice parameters. This methodology offers the promise of circuit intellectual property (IP) re-use which would create new and distinct radiation hard circuit products from existing commercial circuit designs while avoiding costly circuit redesigns.

SUMMARY

It has been discovered that semiconductor devices can be fabricated using conventional designs and process but including specialized structures to reduce or eliminate detrimental effects caused by various forms of radiation. Such semiconductor devices can include one or more parasitic isolation devices and/or buried layer structures disclosed in the present application. The introduction of design and/or process steps to accommodate these novel structures is compatible with conventional CMOS fabrication processes, and can therefore be accomplished at relatively low cost and with relative simplicity.

Accordingly, one aspect of the present invention provides a semiconductor device including a substrate, a plurality of transistors, a buried layer, and a conductive layer. The substrate has a top surface and a bottom surface. The plurality of transistors are formed proximate to the top surface of the substrate. The buried layer is formed via ion-implantation, has a first conductivity type, and is located beneath the plurality of transistors. The buried layer extends substantially continuously beneath the plurality of transistors. The buried layer further comprises a buried layer impurity concentration greater than a substrate impurity concentration. The conductive layer is formed on the bottom surface of the substrate and configured to conduct current from the buried layer to a device package contact.

Another aspect of the present invention provides a method. A wafer having a top surface and a bottom surface is provided. Ions are implanted into the wafer to form a substantially continuous buried layer in the wafer. The buried layer comprises a first conductivity type and a buried layer impurity concentration greater than a wafer impurity concentration. A plurality of transistors are formed proximate to the top surface of the wafer. The buried layer extends beneath the plurality of transistors. A conductive layer is deposited on the bottom surface of the wafer. The conductive layer is configured to conduct current from the buried layer to a device package contact.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

Figure 1B:
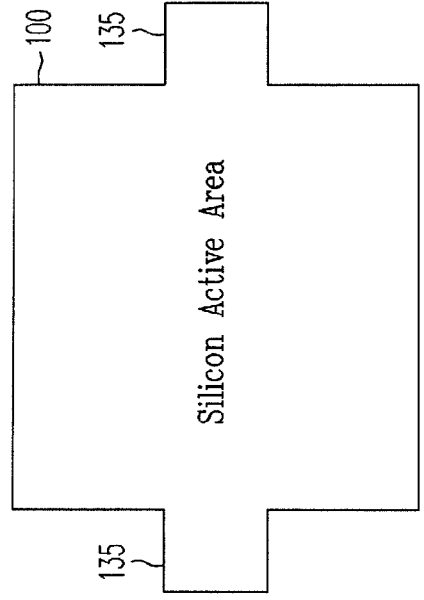
FIGS. 1A-1H illustrate simplified block diagrams of a transistor structure utilizing one of the techniques of the present invention.
Figure 1D:
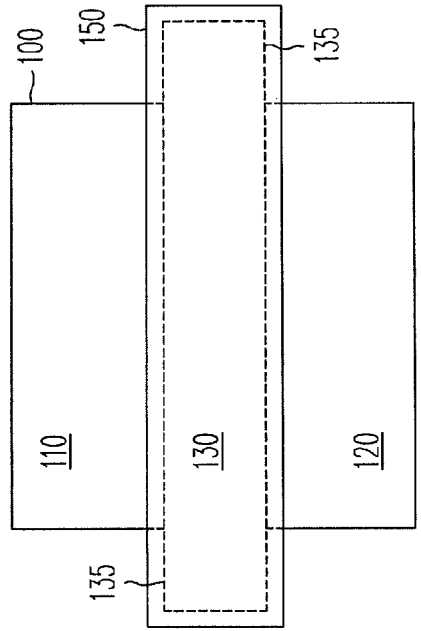
Figure 1A:
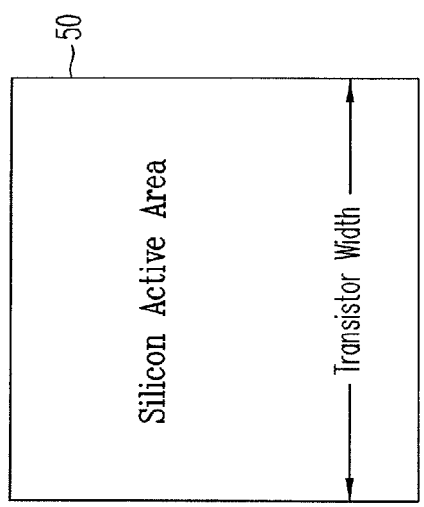
Figure 1C:
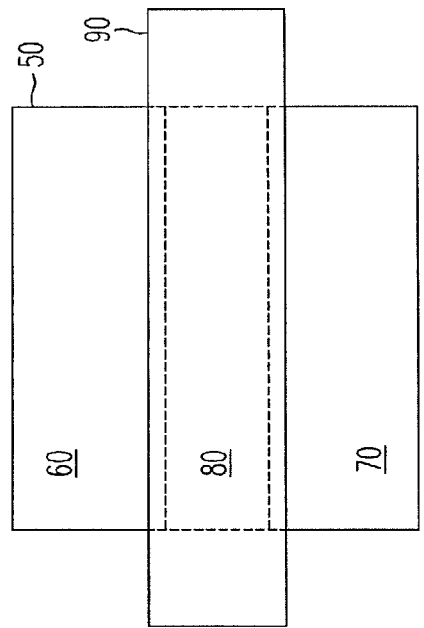

The following sets forth a detailed description of at least the best contemplated mode for carrying out the one or more devices and/or processes described herein. The description is intended to be illustrative and should not be taken to be limiting.

The devices and techniques described in the present application can deliver a complete radiation solution, or in some cases a specialized radiation solution, by directly addressing one or more of the primary degradation radiation effects of ICs: Total Ionizing Dose (TID), Single Event Latch-up (SEL), and Single-Event Upset (SEU). Moreover, the solutions to these degradation mechanisms are accomplished at the silicon process level with modifications to existing foundry baseline process. These unique approaches can be integrated into any CMOS process flow without affecting the performance of the underlying baseline technology. These approaches can further take advantage of a variety of different IC fabrication technologies, such as silicon-on-insulator (SOI) and the like. Additionally, although the examples of the present application will focus on MOS (and particularly CMOS) implementations, it will be understood by those having ordinary skill in the art that the devices and techniques disclosed herein can be extended to other semiconductor architectures such as BiCMOS.

This disclosure describes various structures and techniques that each generally provide some manner of protection from one or more of the degradation effects associated with radiation, and particularly ionizing radiation. When combined, these structures and techniques provide novel radiation hardened process isolation (RHPI) schemes. When integrated into a CMOS process silicon structure, the RHPI structures can significantly reduce the sensitivity of the silicon electrical devices to ionizing radiation, single event latch-up, and single event soft error. The RHPI structures can generally be applied to any MOS or BiCMOS silicon process and will directly improve radiation hardening properties of the integrated circuit both during and after exposure to a radiation environment. Moreover, this is accomplished with little or no penalty to circuit size and or electrical performance. As such, the RHIP schemes can be used as an "add on" feature, which can be applied to existing MOS or BiCMOS process technology, improving radiation isolation properties without the need for extensive process or circuit changes. The RHPI structures enable radiation hardening of commercial digital process by leveraging existing solid state processing technology and re-use of leading edge circuit IP for the creation of radiation hardened circuit product.

Ionizing radiation occurs naturally in the form of high-energy photons or charged particles that possess enough energy to break atomic bonds and create electron-hole pairs in an absorbing material. These particles can include protons, electrons, atomic ions, and photons with energies greater than a bandgap of the absorbing material. When typical integrated circuits, such as CMOS integrated circuits, are exposed to such particles over a period of months or even years, the ionizing radiation can contribute to a total ionizing dose (TID). For example, as an ionizing particle passes through a MOS device, it generates one or more electron-hole pairs which can be trapped in the gate oxides and the field oxides. Electrons in both the $SiO_2$ material and the semiconductor's valence band are raised to the conduction band. A fraction of the electron-hole pairs will undergo initial recombination and cause no damage, but such recombination decreases as the electric field increases, and the electrons and holes that survive it are free to diffuse and drift within the oxide where they will be swept from the insulator, recombine, or be trapped.

Mobile electrons typically move through both gate and field oxides quickly, but the holes have a relatively low effective mobility and are easily trapped in gate oxides and field oxides. Because the trapped holes create a positive oxide charge, the resulting space-charge fields cause negative shifts in the threshold voltages of corresponding transistors. As a threshold voltage shifts negatively, a transistor biased in the off-state lets more and more current pass. If enough holes are trapped, an n-channel transistor will remain fully conducting even with zero applied gate bias, causing, for example, an enhancement-mode device to become a depletion-mode device. In many cases, the edge or field region of the device becomes depletion-mode. Should that happen, leakage currents passing around a device (or from device to device) can cause parameter degradation and, ultimately, device and circuit failure.

Ionizing radiation also boosts the interface trap density in MOS structures. Interface traps are localized electronic states close to the interface between silicon and silicon dioxide and can exchange charge with the silicon conduction and valence bands. They shift threshold voltage and can also degrade mobility by acting as scattering centers. More specifically, the increase in interface states shifts the threshold voltages in the negative direction (more depletion $V_t$) for n-channel devices and in the positive direction (more enhancement $V_t$) for p-channel devices. In addition to the positive oxide shift and the interface states shift described above with respect to n-channel and p-channel devices, threshold voltage shifts caused by ionizing radiation further affect parasitic MOS elements, giving rise, for example, to leakage currents that may cause parametric failure and/or functional failure.

Even more specialized devices can be susceptible to TID. For example, SOI transistors can also be affected by TID through charge buildup in the insulator such as a buried oxide. For partially depleted transistors, charge buildup can invert the back surface causing a source-to-drain (back-channel) leakage current. Moreover, this leakage current is relatively unaffected by gate bias. For fully-depleted transistors, there is significant sensitivity to radiation-induced oxide and interface-trap charge buildup. Positive oxide charge buildup tends to deplete the back-channel interface causing a decrease in the threshold voltage of the front-channel gate oxide and increased back-channel leakage current. Thus, a wide variety of threshold voltage instabilities can result.

Thus, the effects of ionizing radiation lead to the degradation of performance and ultimate failure of the CMOS devices. The additional radiation-induced interface states degrade the circuit performance by reducing the channel mobility, which as a result decreases channel conductance and transistor gain. Over time, the threshold voltages of the n-channel and p-channel devices may shift to such a degree where the n-channel transistors cannot be turned off and the drive capability of the p-channel transistors is not sufficient for the circuit to continue operating at the system clock rate. Such a shift in threshold voltages of either the n-channel or p-channel transistors can cause a circuit to fail.

FIGS. 1A-1H illustrate one approach to addressing the parasitic effects associated with TID in a conventional MOS device. Transistor 100 (shown in FIGS. 1B and 1D-H) differs from conventional MOS devices (shown in FIGS. 1A and 1C) in that channel region 130 of transistor 100 includes two channel region extensions 135. In traditional MOS devices like transistor 50, source (60), drain (70), and channel regions (80) are typically fabricated to have approximately the same width as shown. However, as shown in FIGS. 1B and 1D-H, source region 110 and drain region 120 have approximately the same widths while channel region 130 has a greater width leading to channel region extensions 135 that extend beyond the edges of the source and drain regions, i.e., beyond the channel region's typical interfaces with each of the source and drain regions. Channel region extensions 135 are typically formed by an extension of the silicon active area from which the source, drain, and channel regions are formed, or by formation of mesa regions immediately adjacent to the channel region. Because of their role in reducing the parasitic effects associated with TID, these extended active area structures can be referred to as parasitic isolation devices (PIDs).

Figure 1E:
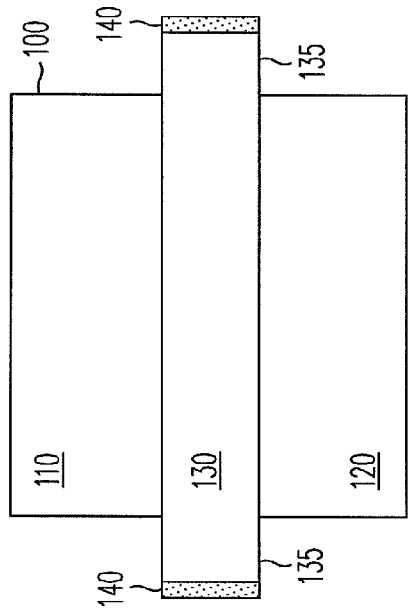

Each of channel region extensions 135 have a width x and a length y (FIG. 1E). Although FIGS. 1B and 1D-H illustrate channel region extensions 135 having approximately the same dimensions as each other, this need not be the case. Channel region extension length y is typically smaller than the length of polysilicon gate 150, while channel region extension width x can be selected to provide the desired device features. The increased length of the channel edge caused by the extensions, i.e., and increase from y to 2x+y, serves to increase the effective channel length of channel region 130 to a value greater than the case where the channel region terminates "flush" with source and drain regions 110 and 120. By increasing the net channel edge length, channel region extensions 135 lead to significantly reduced OFF state leakage due to the attenuation of parasitic transistor short channel effects.

Figure 1F:
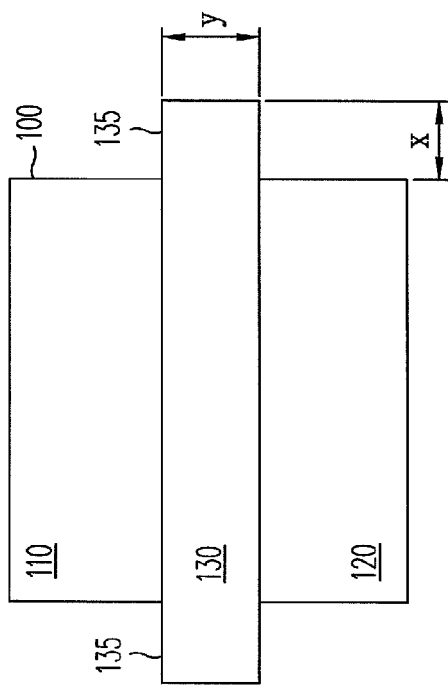
Figure 1G:
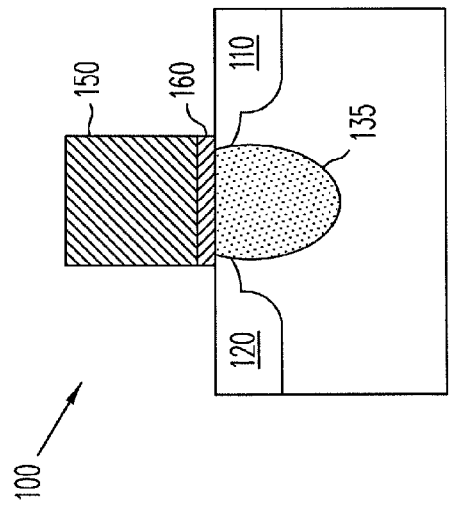
Figure 1H:
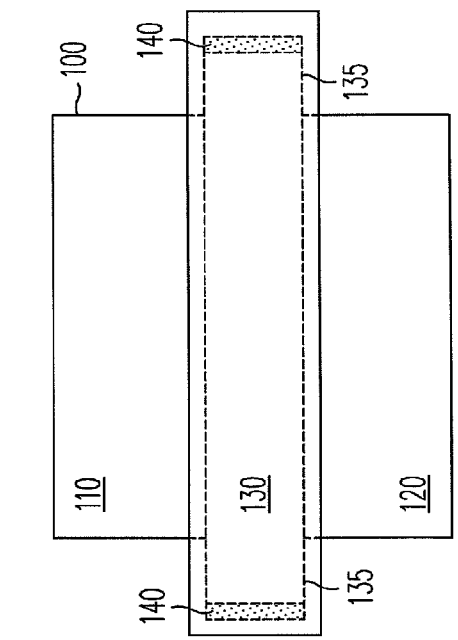

In a typical implementation, the PID structure effectively increases the channel length along the perimeter by more than a factor of two. The geometry of the PID provides for selective doping within specific regions 140 as shown in FIGS. 1F-1H. FIGS. 1F and 1G show top views of device 100 including channel extension impurity regions 140, typically formed along the length of channel region extensions 135. Channel extension impurity regions 140 are typically formed to have relatively high impurity concentrations, and are introduced to overlap end portions of the channel region extensions so that the impurity concentration of these end portions is increased relative to the impurity concentration of those portions of the channel region 130 located between source region 110 and drain region 120. For example, where the channel region has a p– impurity concentration, channel extension impurity regions 140 form a pair of p+ channel stops. This relatively high impurity concentration of the channel stop insures that the parasitic sidewall threshold is higher than any negative threshold shift which might be induced by ionizing radiation. These more heavily doped extension impurity regions are typically spaced apart from the endwall edges of source and drain regions 110 and 120 by respective portions of the extension regions of the same doping concentration as channel region 130 itself, so that the more heavily doped channel extension impurity regions do not form p+/n+ junctions with the source and drain regions 110 and 120. Such junctions can have very low breakdown voltages, thereby adversely effecting device performance. The extension width x is generally determined by the choice of doping ion and the manufacturing process's thermal diffusion exposure. For example, a boron doped PID structure would typically have a larger extension width x as compared to an Indium doped PID structure. Thus, extension width will typically be driven by concerns about excess back-diffusion and enhanced doping of the transistor active area. In general, either acceptor or donor impurities can be used to form channel extension impurity regions 140. Variation of impurity type, implant energy, and dose will typically provide different types and/or levels of radiation isolation improvement. For example, doping of the channel extension impurity regions can range from zero (i.e., no doping) to $5\times10^{15}$ cm$^{-2}$ or even higher, as required. This process solution for TID is therefore "tunable," e.g., by varying PID dose, the transistor TID capability can be increased or decreased as a function of the dose.

In addition to laying out the extensions of the silicon active area, formation of channel extension impurity regions is typically performed using a photomasking step (e.g., depositing photoresist, exposing the photoresist using a photomask, and developing the exposed photoresist) that exposes desired portions of the channel extension while masking off other portions of the device. Next, one or more ion implantation operations are performed to dope the channel extension impurity regions to desired levels. In subsequent steps, the photoresist for the channel extension impurity regions is removed, and other device features are fabricated, such as gate electrode 150. A gate electrode such as a polysilicon gate further protects the channel extensions from subsequent doping steps, e.g., source and drain implant steps. Moreover, because the channel extensions are covered by, for example, polysilicon and are distinctly separated from the transistor channel active area, this design avoids the problem of overdoping in the channel that could interfere with the transistor's threshold voltage.

As shown in FIG. 1G, channel region extensions 135 are located below (and hidden by) gate electrode 150, which allows self aligned conventional processing to be used subsequent to PID formation. In the case of n-channel devices, the channel region extensions when combined with impurity doping can be used to prevent unwanted electrical inversion (threshold voltage depletion) of the edges (or sides) of the n-channel transistor silicon channel area. This sensitive region generally extends below the gate electrode between source region 110 and drain region 120, as illustrated in FIG. 1H which shows an end view of the device. Thus, in some embodiments, channel extension impurity regions 140 are formed to extend to a depth greater than the depths of the source and drain regions. The PID can likewise be used in p-channel transistors to prevent threshold voltage enhancement (opposite of n-channel) caused by positive charge accumulation along the active area edge of the PMOS transistor active area.

In general, integrating the fabrication of a PID structure into a commercial semiconductor fabrication process is straightforward because the fabrication module is a combination of an active area geometry change and ion implantation, both of which are relatively non-invasive to other process steps. For example, PID integration into a commercial foundry process could include the following operations: (1) process, device, and circuit simulations are executed on the foundry process-of-record (POR) (e.g., layout ground rules, process information details, etc.) to establish calibration and proper baseline framework for PID integration; (2) process and device simulations are executed within the context of the foundry POR to verify PID size, doping, and subsequent diffusion to the transistor active area; (3) changes are made to the device active area (e.g., p-well active area) to add PID structure, then a PID implant masking step is added to the foundry POR; (4) a PID ion implantation step is added to foundry POR. These operations should have little or no impact to either n-type or p-type MOSFETs UV characteristics. Electrical performance is minimally affected.

Thus, the PID structure reduces or eliminates parasitic field transistor inversion which reduces or eliminates a major source of $I_{off}$ leakage caused by charge build-up at the silicon/$SiO_2$ (160) boundary. Moreover, the PID structure doped region provides for local minority carrier lifetime reduction, reduced sensitivity to substrate noise and body voltage effects, and enhances the transistor snap-back voltage. The PID structures described herein can be fabricated in both bulk silicon and silicon films, such as silicon-on-insulator (SOI).

Latch-up generally, and in the case of circuits in radiation environments SEL, is a serious failure mode in CMOS circuits. In the best case, latch-up results in soft failure with a loss of data or logic state. In the worst case, latch-up causes a destructive hard failure with permanent loss of the circuit. Thus, from a circuit reliability perspective, latch-up is to be avoided at all costs. As isolation widths shrink, device structures become even more susceptible to both latch-up failure modes. Prevention of both transient and destructive failures is very important in advanced CMOS IC's since most conventional CMOS technologies have largely converged on the use of p- bulk substrates. As noted above, radiation environments present special problems to CMOS circuits in that high-energy particles deposit significant electrical charge to the bulk substrate. The instantaneous appearance of static charge deposited by a high-energy particle passing through an IC can immediately induce large displacement currents on the picosecond time scale accompanied with rapid potential shifts away from initial logic states. The deposition of energy by the particle typically causes diodes to forward bias, followed by large transient injection currents which reinforce the transient upset and can cause the CMOS circuit to latch up.

Figure 2:
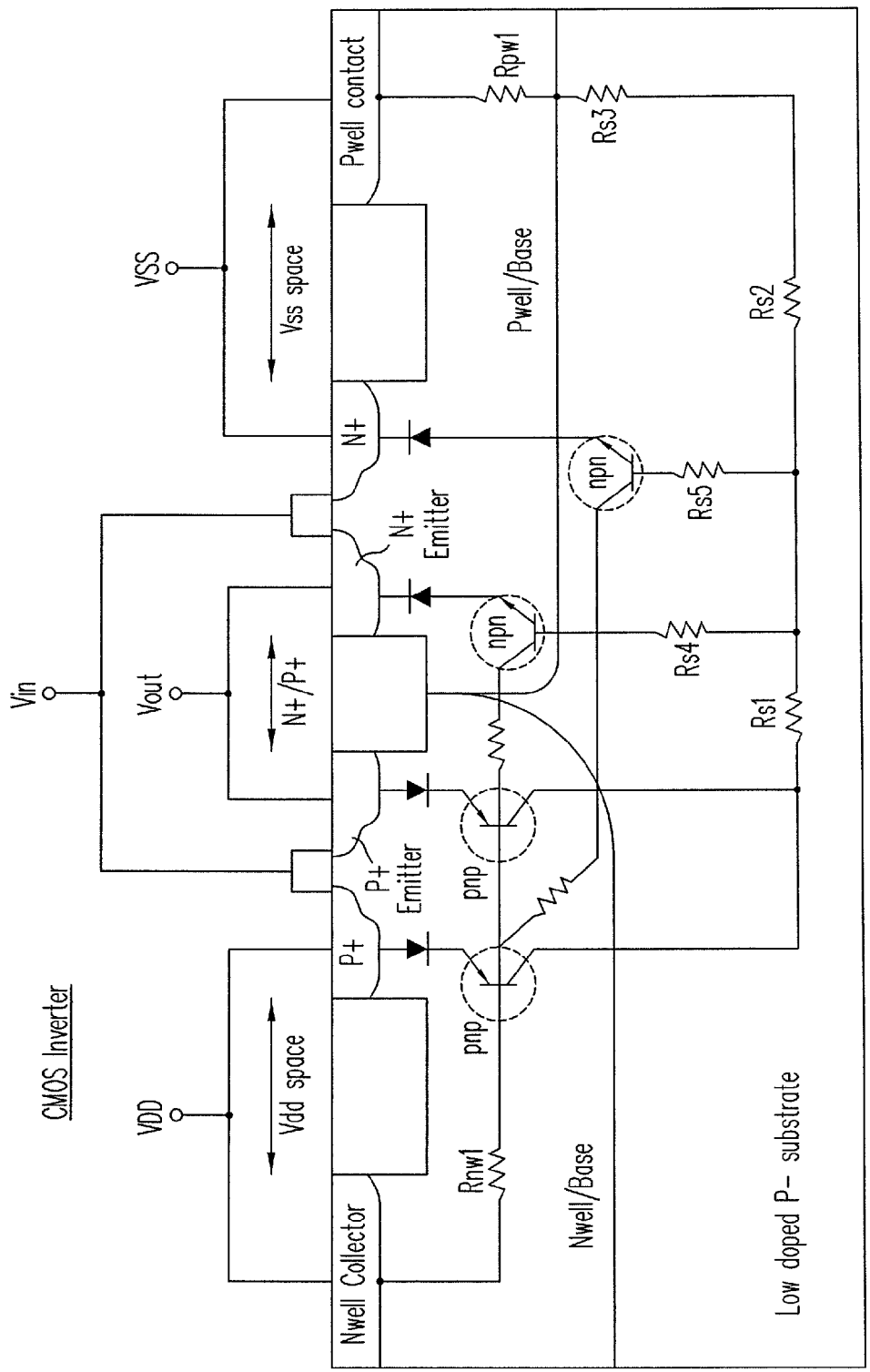
FIG. 2 shows a cross-section diagram of a CMOS inverter formed on a p− substrate.

Latch-up in a conventional CMOS inverter circuit is illustrated in FIG. 2. FIG. 2 shows a cross-section diagram of a CMOS inverter formed on a p- substrate. An equivalent circuit diagram is also shown in FIG. 2 overlaid on the CMOS inverter. In CMOS technology, the basic switching circuit is an inverter formed from a complementary pair of MOS transistors, one NMOS and one PMOS. Electrical isolation is achieved by using both dielectric and pn junction diodes. P-type doped regions (p-wells) isolate NMOS transistors, while n-typed doped regions (n-wells) isolate PMOS transistors. FIG. 2 illustrates the parasitic electrical elements, bipolar transistors, resistors, and diodes that co-exist within the CMOS structure. The source and drain regions of each MOSFET in the inverter form bipolar emitters. In normal operation, the circuit maintains a reverse bias of the diodes formed by the n-well/p-substrate, the p+/n- junction of the PMOS and the n+/p- junction of the NMOS. External factors such as leakage, circuit switching noise, particle upset, and transient overvoltage at the p+ diffusion or undervoltage at the n+ diffusion can trigger one of both of the parasitic bipolar devices into the active state. If either of the emitter or base junctions is forward biased, emitter currents will be sourced to corresponding base/collector regions, immediately shifting the local potential from its initial voltage state.

The network parasitic devices forms a pnpn silicon controlled rectifier (SCR) power device which can be unintentionally biased into a high current, low impedance state, thereby causing latch-up. The circuit elements $R_{S1}$, $R_{S2}$, and $R_{S3}$ are the net effective bulk p- substrate resistors, while $R_{NW1}$ is the n-well series resistance and $R_{PW1}$ is the p-well series resistance. In conventional technology substrate resistors would have resistances on the order of 1 kΩ or greater. In a typical example of CMOS circuit operation, the bulk substrate represents ground potential (0 volts) and is referred to as $V_{SS}$. If current is injected from any source available to the p- substrate, the local potential (within the p- substrate) will increase in magnitude above zero volts as a function of the high value substrate resistance. The n+/p- diffusion diodes located in the p-well, and which were previously undisturbed, would then enter a forward biased conduction as the P-substrate potential increases above approximately 0.3 volts. It is this second contribution by the previously undisturbed n+/p- diffusion diodes which now positively enhances the initial small signal upset event, and can lead to latch-up. Likewise the same event is possible starting with forward biased p+/n- diffusion diodes which are located within the n-well isolation doping region that is caused by either an over voltage of the p+ diffusion or a transient under voltage condition existing within the n-well local potential, which typically equals the circuit supply voltage or terminal voltage ($V_{DD}$, or $V_{CC}$).

Thus, the network of series resistors plays a direct role in the transient bias states of the different impurity doped regions, which then directly influences the bias and conduction state of the diodes. Latch-up can be prevented by keeping the diodes in their reversed bias (off) states. A first step in reducing or preventing latch-up is reducing the effective resistance of p- substrate resistors $R_{S1}$ and $R_{S2}$. The p- substrate resistance can be reduced using a high-dose buried layer (HDBL) 300 as illustrated in FIG. 3.

Figure 3:
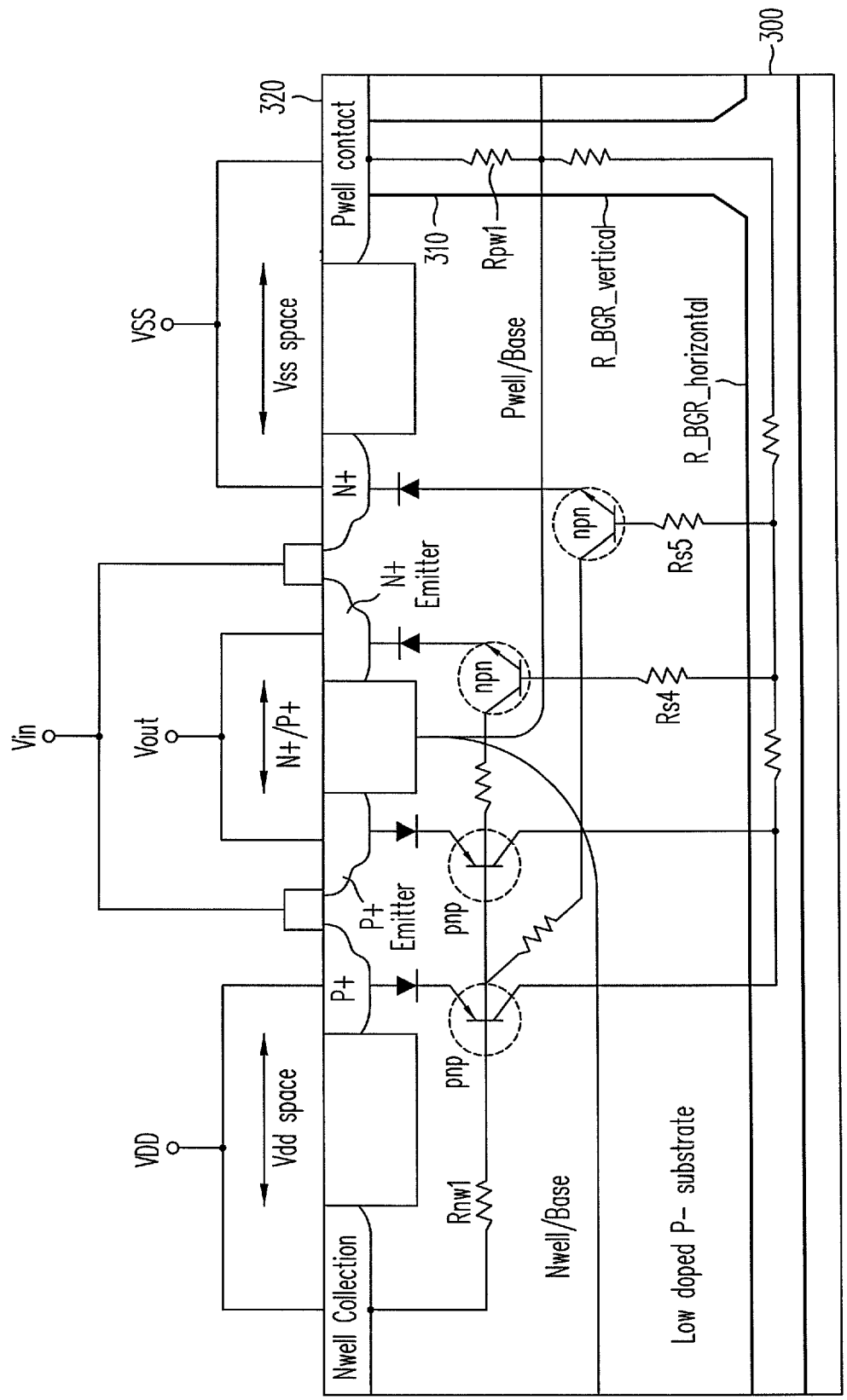
FIG. 3 illustrates a simplified block diagram of an inverter structure utilizing several of the techniques and devices of the present invention.

In the example of FIG. 3, the various transistors of the device are fabricated proximate to the surface of the bulk substrate, i.e., they are formed in and/or on substrate in the vacinity of the wafer's top surface. HDBL layer 300 is a heavily doped region of the same conductivity type as the p- substrate, and is placed beneath the active device regions of the device by ion implantation. In general, both the doping and damage characteristics of the HDBL can influence device performance. HDBL structures are easily integrated into standard CMOS processing with the addition of process steps such as, a high energy/high dose ion implant step, a post implant rapid thermal anneal (RTA) step, as well as an optional cleaning step in between the implant and anneal. The process steps associated with the HDBL can be performed either before or after dielectric isolation ($SiO_2$) formation either by LOCOS or the use of a shallow trench isolation (STI) structure common in many CMOS processes. While a variety of different impurities can be used, the most common implants are boron implanted at 0.4-2.5 MeV (for p-type substrates), and phosphorus at 1.0-3.5 MeV (for n-type substrates). If a wafer-normal to ion implant beam angle of zero degrees is set during ion implantation, the necessary energy to achieve a desired depth of the ion implant can be significantly reduced. Implanted doses typically vary between $1\times10^{13}$ and $5\times10^{15}$ $cm^{-2}$, which forms a highly doped and abrupt layer approximately 0.6-5.0 µm below the silicon surface. The buried layer is typically implanted sufficiently deep so that the final dopant profile (after all thermal processes) does not counterdope the retrograde well of opposite conductivity, which results in low well-substrate breakdown voltage. Although the examples illustrated in the present application include continuous HDBLs (e.g., formed using a blanket implant of an entire wafer), HDBL structures can be formed in various patterns as desired by using suitable photomasking operations. For example, a discontinuous HDBL can be formed eliminating regions near n-wells.

For example, in the case of FIG. 3 where the substrate is p−doped, the deep p+ layer provides a low resistance shunt 300 that significantly reduces the series resistance between the pnp subcollector (below the n-well) and the p+ collector ($V_{SS}$). Forming a p+ shunting layer 300 via implantation also gives circuit designers the option of patterning the implant to independently optimize substrate resistivities in different areas, e.g., for a system-on-chip design. Thus, substrate resistors $R_{S1}$ and $R_{S2}$ are now significantly reduced, typically by more than two orders of magnitude, because of the presence of HDBL 300. The spreading resistance of the region can be lowered to less than 50Ω as compared to 2 kΩ or more for conventional CMOS isolation.

HDBL implants can be implanted at various angles to affect ion placement (Rp) and spread (dRp). More specifically, zero angles can be used to increase doping channeling which results in both a deeper implant (Rp) and broader distribution of the implant (dRp). This effect can be used to distinct advantage when the HDBL implant energy is limited by the blocking capability of the photomask and a deeper ion implant is needed. In such cases, the ion can be made to channel and will reach a final depth into silicon which is more than if the ion was implanted at non-channeling tilt angles. Channeling angles (with respect to the surface normal) are typical from zero degrees to 2 degrees, with angles above 2 degrees more typical of non-channeling ion implantation. However this can also be affected by the use of different silicon crystal cuts which are used to change the orientation of the crystal to the ion beam direction. Using multiple ion implants at varying implant energies, dose and angle can be used to perfect the vertical doping profile to the benefit of the device protection scheme. Using blanket and masked ion implants, desired "net doping regions" can be realized to yield device protection.

A second step in addressing latch-up and other substrate current transients is to provide conductive pathways from the HDBL to a suitable device pin, e.g., a ground pin. In some embodiments, this is accomplished by reducing the significant vertical resistance. Addition of a vertical conductor 310 extending between the buried layer 300 and a p-well contact region (as shown) or some other substrate surface terminal significantly reduces this resistance. In one embodiment, the vertical conductor 310 is formed as a vertical impurity region having the same conductivity type as the substrate, but typically having an impurity concentration greater than that of the substrate. For example, where the substrate is a p− substrate, vertical conductor 310 can be formed from one or more p+ implants into the region extending between p-well contact 320 and buried layer 300. High-energy ion-implantation combined with photoresist masking and/or multiple energy implantation can provide a vertical p+ doped region with high aspect ratio doping profile to bridge the uplink path from an ohmic $V_{SS}$ surface contact or Schottky diode to buried layer 300 or other p+ bulk layers as is typical for p− epi on p+ bulk substrates. For example, in one implementation vertical conductor 310 is formed by multiple ion-implant steps at one or more energy levels.

When buried layer 300 and vertical conductor 310 are used in conjunction with each other, a new structure referred to as a buried guard ring (BGR) is formed. The BGR offers several isolation attributes. Since the low resistance deep buried layer is now locally connected via a vertical doping region or other conductor: (1) minimum impedance is provided for most or all of the accumulated, deposited or injected charge occurring within the silicon substrate region; (2) transient times for charge termination are reduced thereby improving overall isolation by reducing or minimizing the duration of any n+/p− diode forward biasing which reduces injected currents; (3) the BGR forms a low-resistance circuit leg back to the p-well contact terminal, thereby creating a current divider which effectively shunts and sinks a majority of any injected or deposited current away from the $R_{S4}$ and $R_{S5}$ resistor legs, thereby significantly reducing base current feedback to the parasitic npn devices shown and limiting voltage transients for the p-bulk silicon region associated with the CMOS structure. The BGR structure, by effectively shunting injected current or stray charge promptly to the $V_{SS}$ terminal, reduces or prevents voltage transients which could subsequently forward bias either or both of the n−/p− diodes (n-well/p-substrate diode inherent in CMOS twin well isolation) and the n+/p− diodes (inherent in NMOS transistor) and eliminates subsequent triggering of the pnpn SCR network. Latch-up with the BGR isolation structure present then becomes difficult or impossible to initiate, thereby preserving the circuit from ever entering destructive latch-up.

Examples of various BGR implementations can be found in U.S. patent application Ser. No. 10/951,283 (now U.S. Pat. No. 7,304,354) entitled "Buried Guard Ring And Radiation Hardened Isolation Structures And Fabrication Methods," naming Wesley H. Morris as the inventor, which is hereby incorporated by reference herein in its entirety. As described in the '283 application, the vertical contact can be formed in various ways, including one or more ion implantation operations, formation of a vertical metalized conductor, etc.

Figure 4:
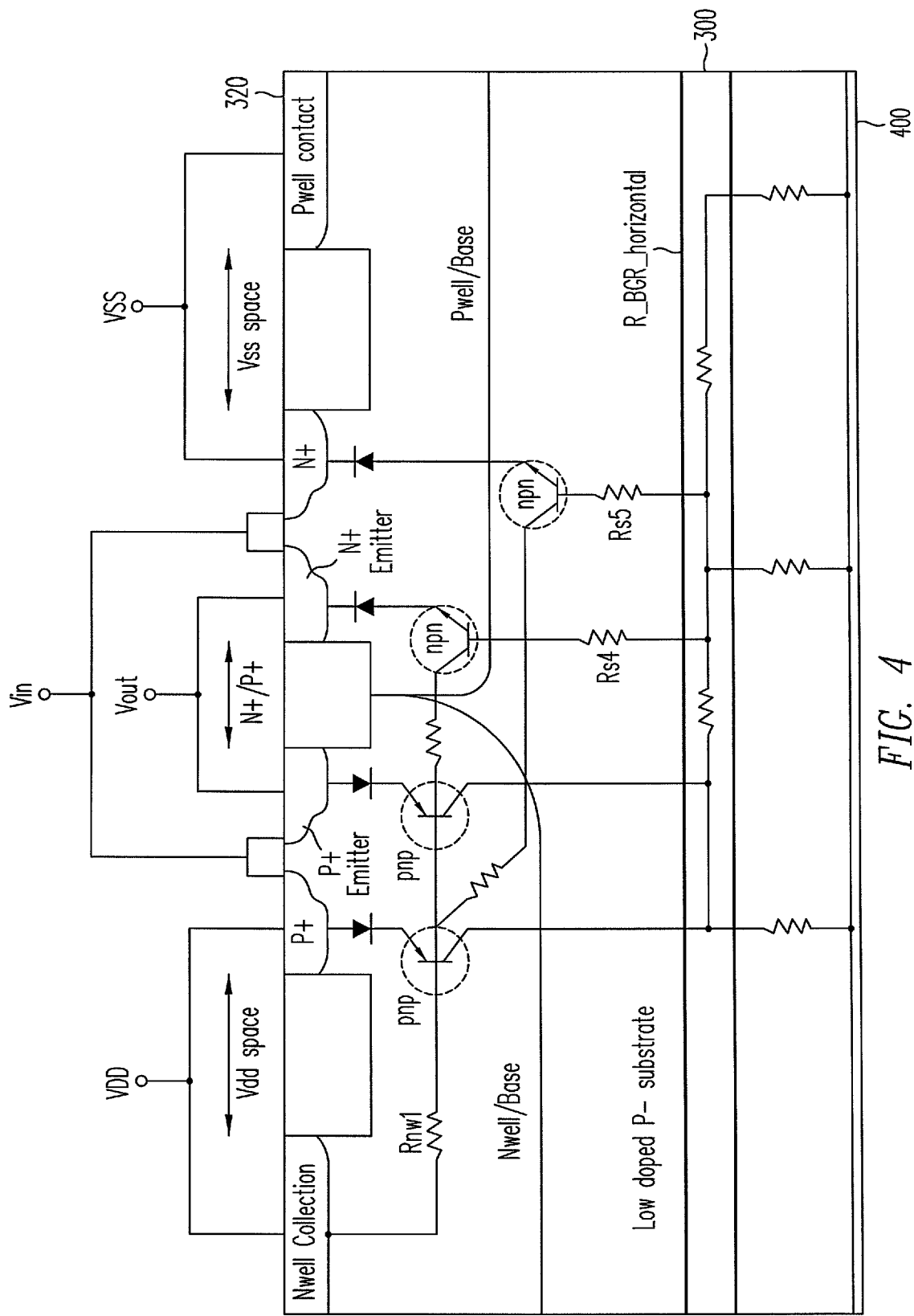
FIG. 4 illustrates a simplified block diagram of an inverter structure utilizing additional techniques and devices of the present invention.

In other embodiments, conductive pathways between the HDBL and the backside or bottom of the die on which the device is fabricated are used to deliver current to a suitable device pin, e.g., a ground pin. FIG. 4, illustrates a simplified diagram of an inverter structure utilizing such backside contact. The device of FIG. 4 is similar to that of FIG. 3, but there is no vertical conductor. Instead, HDBL layer 300 is electrically coupled to the backside 400 of the die. The backside is typically metalized to provide a continuous conducting surface through which the die can be electrically coupled to suitable device package contact such as a package substrate, leadframe, or pins (not shown). One or more contact electrodes can be fabricated on the backside to facilitate contact with the device package. Although the entire backside of the device is shown as metalized, in other examples only certain portions (e.g., contact pads) of the backside are metalized. In still other embodiments, no metallization is required, and device packaging is directly contacted to the backside of the die using, for example, solder bumps, contacts, or the like. In the example of FIG. 4, HDBL 300 is formed in a low doped p− substrate. The native resistance of the portion of the substrate between HDBL 300 and backside 400 will typically be low enough to provide adequate conduction out of the device. For example, boron doped p− substrates can have resistivities in the range of approximately 20 ohm-cm to 0.5 ohm-cm. More highly-doped substrates can have resistivities well below 0.5 ohm-cm. For such backside connected HDBL devices, the HDBL is typically formed as in the case of the BGR devices described above. In still other embodiments, backside connection of the HDBL can be combined with the use of the vertical conductors described above in connection with FIG. 3, and those described in the '283 application.

Figure 5:
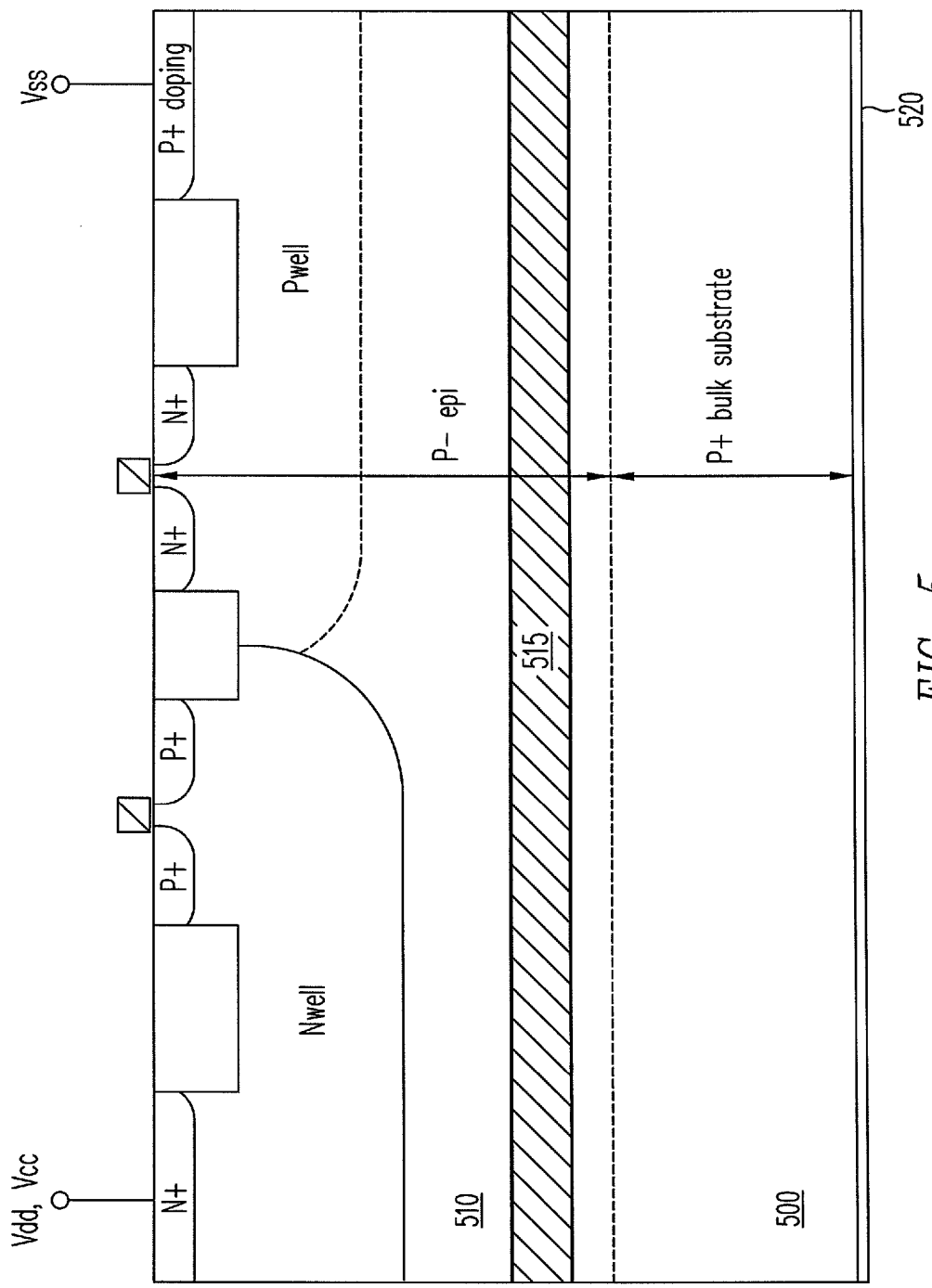
FIG. 5 illustrates a simplified block diagram of an inverter structure utilizing still other techniques and devices of the present invention.

In still other embodiments, different substrates are used. For example, FIG. 5 illustrates a device fabricated in a p− epitaxial layer 510 grown on a p+ silicon substrate 500. Here, the various transistors of the device are fabricated proximate to the surface of the bulk substrate 500, i.e., they are formed in and/or on epitaxial layer 510. HDBL 515 is also included in this device, and here it is shown within epitaxial layer 510, but located close to the boundary between the epitaxial layer and substrate 500. In other embodiments, HDBL 515 can be formed straddling that boundary, or formed below the boundary and wholly within substrate 500. As described above, the device includes a backside contact 520 for further coupling to package pins.

In embodiments such as those illustrated in FIG. 5, the resistance of the pathways between HDBL 515 and backside contact 520 can be further reduced by doping substrate 500. P+ starting wafers having resistivities between 0.01 and 0.005 ohm-cm can be readily achieved. More lightly doped substrates (i.e., higher resistivities) can also be used. The epitaxial p− layer is typically grown on the p+ substrate with enough thickness to accommodate the NFET and PFET devices without interference from the starting p+ doping. Consequently, the implant operation(s) used to form HDBL 515 can be performed before or after epitaxial layer growth. Note that although the example illustrated is a p− epitaxial layer on a p+ substrate, various other implementations can be fabricated with an HDBL and backside contact including: n/n+, p/n+, n/p+, and multiple epitaxial layer devices, e.g., p/p/p+ and the like.

Figure 6:
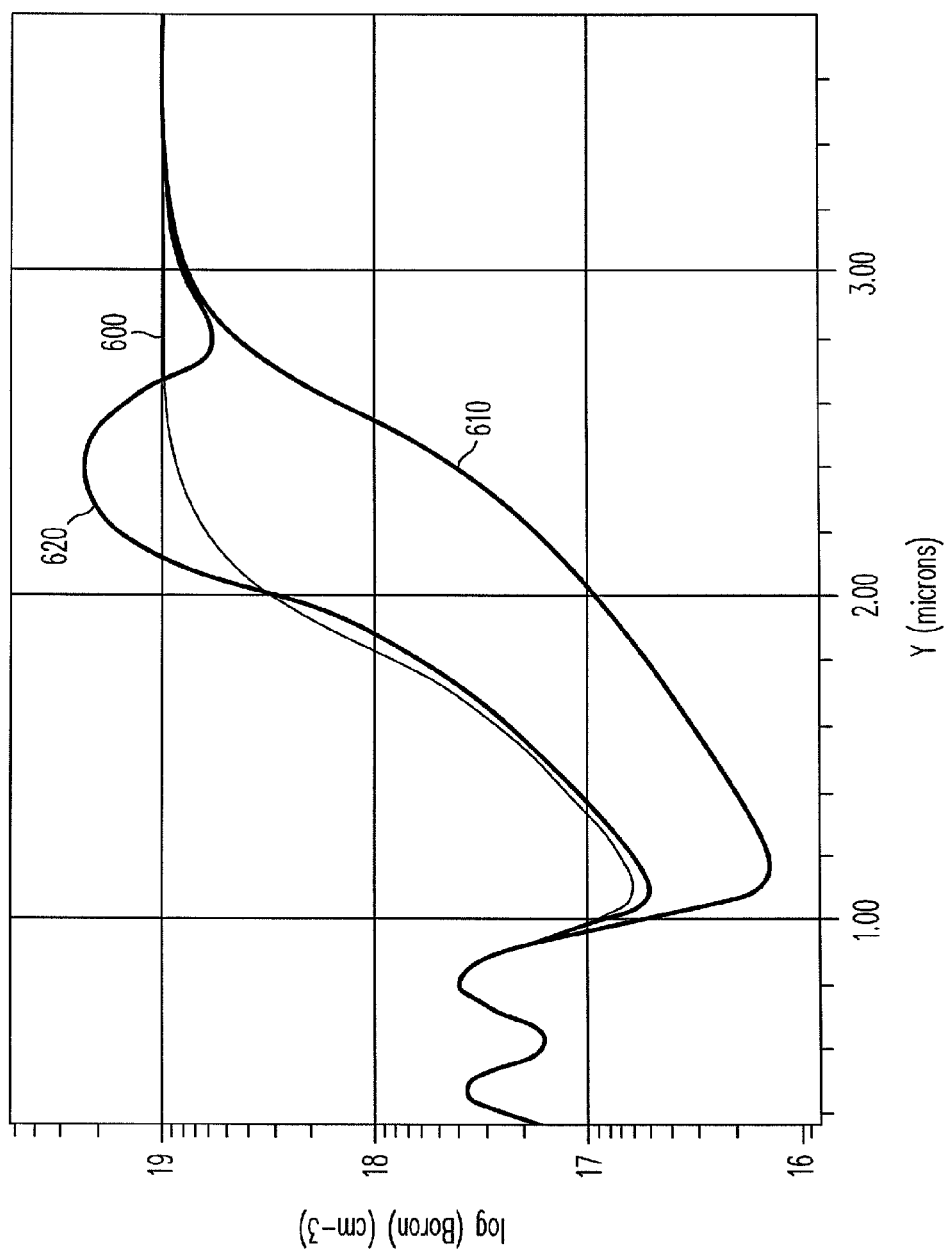
FIG. 6 illustrates several boron doping profiles.

FIG. 6 illustrates simulated boron doping profiles on such epitaxially grown wafers. Boron doping is plotted against depth through the epitaxial layer into the starting wafer. Doping profile 600 illustrates boron doping in a wafer having a thin epitaxial layer (e.g., 2.0 μm) while doping profile 610 illustrates boron doping in a wafer having a thicker epitaxial layer (e.g., 3.0 μm). In both cases, no HDBL is present. During the epitaxial layer growth step, the p+ doping from the starting wafer out diffuses into the epitaxial layer. This creates the long and rather gradual tail (increase in boron concentration) as shown in FIG. 6 between approximately 1.1 μm to approximately 3.0 μm in depth. However, a more abrupt transition between the p− doping in the epitaxial layer, and the p+ doping in the wafer is desired. Doping profile 620 illustrates boron doping in a wafer having a thick epitaxial layer (e.g., like that of profile 610) but with the addition of an HDBL. Because the HDBL maintains a high profile slope over a wider range of concentrations than does the out-diffused boron from the initial wafer, it can be moved in closer to the active device region. This reduces both the series resistance and the sensitive device volume, and accomplishes these benefits without interfering with normal device operation. Note that the epitaxial thicknesses illustrated in these simulations are not necessarily optimized, but merely illustrate the advantages of the HDBL.

Another advantage of the HDBL layer is that a higher peak value of boron doping can be created. Once current is collected into the HDBL, it is free to spread laterally before continuing through to the backside contact, thus reducing overall resistance and possibly allowing for moderately reduced conductivity of the starting wafers. The additional doping at the surface is expected to reduce overall substrate resistance by much more than that same dose would if it were spread uniformly throughout the wafer. Although boron is used as an example of the dopant species used in the devices described above, various different dopants can be used depending on, for example, desired device characteristics, device type, compatibility with other processes, and the like. Examples include: phosphorus, indium, arsenic, and the like. Moreover, HDBL's of varying conductivity type can be used. Thus, although the examples describe various p-type HDBLs, heavily doped n-type doping layers can be placed into n-well doping regions which are contacted to $V_{dd}$ through the n-well doping. These n+ doping layers would act as shunt layers in certain types of protection schemes used in, for example, ESD devices where it is desirable to lower the local n-well resistance of these structures. Similar p+ HDBL layers can be formed using masking and lower implant energy in p-wells in the same fashion.

The disclosed devices including an HDBL with a backside contact offer several advantages including: process and design portability, compact layout, and reduced impedance. In the case of process and design portability, these devices can be more easily integrated into existing fabrication processes because they utilize either a conventional (e.g., lightly doped p− substrate) starting wafer or a slightly different starting wafer (e.g., a p−/p+ epi wafer) and a blanket or patterned implant for the HDBL. Circuit layouts originally designed for standard bulk wafers will generally work with the disclosed devices without requiring design or layout changes. The HDBL with a backside contact also keeps device p-wells and the HDBL well contacted without the need for additional top-side p-well contacts, which would impact circuit layouts. Consequently, these contacts and contact diffusions can be removed (e.g., not included in the circuit design), optionally, to reduce space. The HDBL with a backside contact will generally have both less resistance and less inductance to ground than other devices. In turn, this will make it that much more difficult for a high-LET strike to forward-bias any of the parasitic bipolar junctions. Any circuit manufactured on lightly doped p− material is at risk for latch-up and single event error caused by high energy radiation particles and is not qualified for used in these radiation environments. By adding the HDBL and the backside contact scheme, the circuit becomes immune to latch-up caused by single event radiation or transient dose rate events. Those applications which require high immunity to latch-up or transient events, such as dose rate, can now be accomplished using the same circuit (with HDBL and back side contract added) that previously could not qualify. The improved latch-up performance would thus increase the value and application space for any circuit type which used the HDBL and backside contact.

Although various wafer resistivities can be used, the best doping level for the starting wafers (in the case of epi wafers) or bulk wafers will likely depend on the application and on design trade-offs between eddy current loss (particularly important in rf designs) and series resistance from the HDBL to the backside contact. Moreover, various different HDBL thicknesses and depths can be employed, depending in part on, for example, substrate system (e.g., bulk or epi wafers), epitaxial layer thickness, and device performance characteristics. Optimization of the HDBL with a backside contact can be made by using various substrate doping types such as p−/p+ epi with epi layers as thin as approximately 1.5 μm or in the case of bulk p− doped substrates, as lightly doped as, for example, 20 ohm-cm.

Once the remainder of the integrated circuit is fabricated, several additional steps are typically performed to prepare the device for connecting the backside to the device package. For example, the wafer on which the integrated circuits are fabricated can be thinned to reduce the amount of substrate material between the HDBL and the backside, thereby reducing the resistance of the path between the HDBL and the backside. Wafer thinning techniques include: mechanical grinding, chemical mechanical polishing (CMP), wet etching (etchants for silicon are typically mixtures of HF and $HNO_3$), and dry etching techniques such as atmospheric downstream plasma (ADP) dry chemical etching (DCE). Additionally, the backside of the device is typically metalized to provide good electrical contact to the device package. Various metallization techniques such as chemical vapor deposition, electroplating, and sputtering can be used to deposit one or more metal layers on the backside of the device. In many embodiments, multiple metallic layers are formed as part of the entire process of backside metallization. Metals and alloys that can be used include: Ti, NiV, Ag, Au, Cr, AuAs, Ni, AuGe, and Al. Note that some of these materials are used as intermediate layers to enhance the adhesion of other metal layers to the device backside. Various other metals and alloys can also be used.

Figure 7:
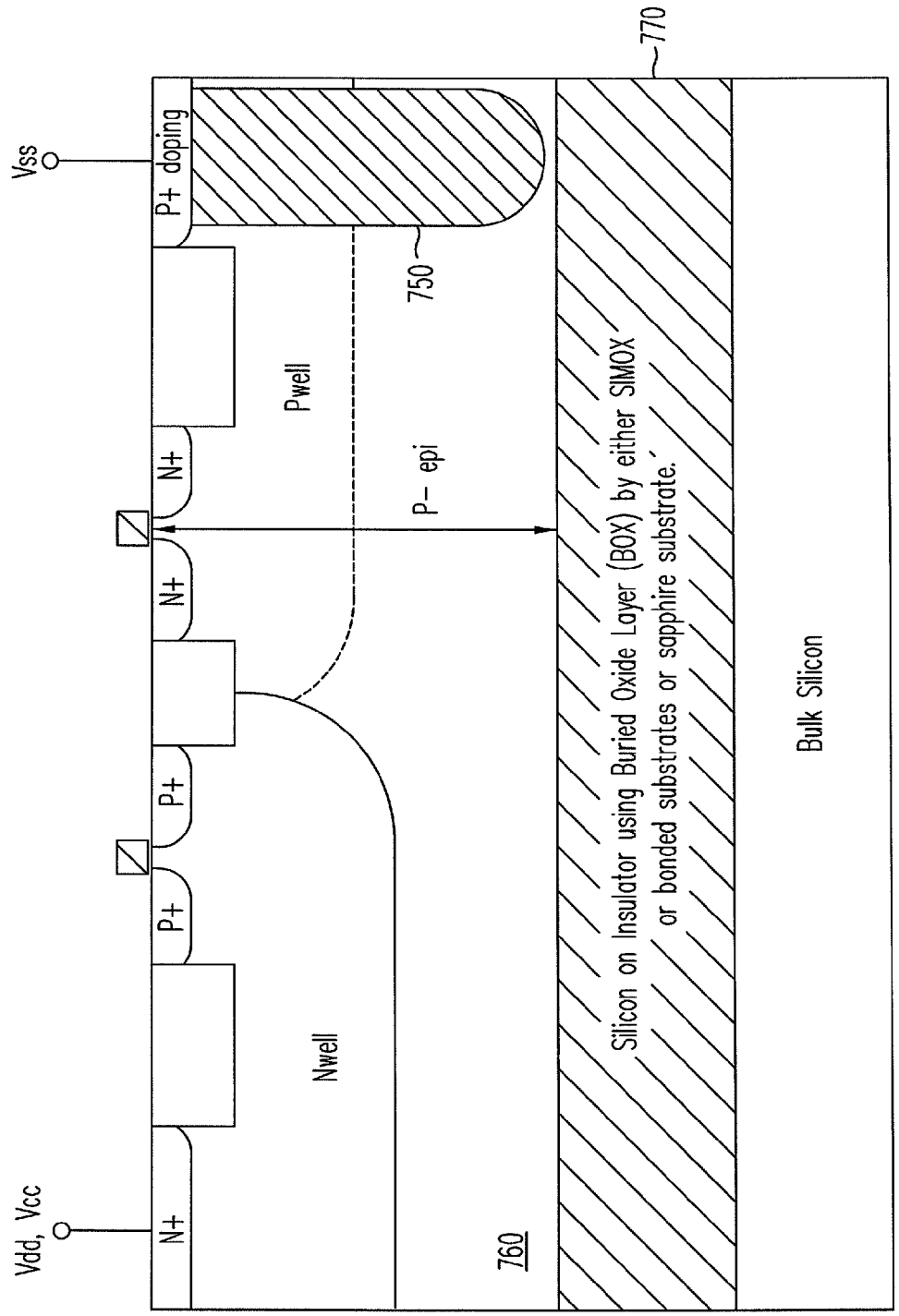
FIG. 7 illustrates other embodiments of the present invention.

The aforementioned '283 application describes various embodiments using silicon-on-insulator (SOI) technology. SOI devices typically include a thin layer of silicon, e.g., from 50 nm to 100 μm, which is created on an insulating substrate such as sapphire or silicon with an insulating layer of silicon dioxide. The buried oxide layer can be formed on the surface of a silicon layer, with subsequent growth of a thin silicon layer on top of the oxide or bonding of another wafer. In other examples, the buried oxide layer can be formed using oxygen ion implantation followed by high temperature annealing to create a buried $SiO_2$ layer, i.e., separation by implantation of oxygen (SIMOX). Other SOI techniques are known in the art. FIG. 7 shows an implementation where vertical conductor component 750 is formed in an epi layer 760 which in turn has beneath it a buried oxide layer (BOX) 770 (or other SOI implementation) formed using well known SOI techniques.

Unlike many conventional SOI devices, epi layer 760 is thick enough that the BOX layer 770 has essentially no effect on normal device operation. Source and drain depletion regions typically do not extend down to the BOX layer, as would be common for fully depleted SOI devices. This allows for lateral n-well and p− contacts with minimal or zero layout change for transferring circuits originally designed for bulk wafers. Recent technological improvements in wafer bonding have enabled commercially competitive SOI wafers with a wide range of epitaxial and BOX thicknesses. Vertical conductor 750 can be formed, for example, using a set of high dose, high-energy implants at the p-well contact, or other vertical conductors can be used. Note further that bipolar parasitics can be greatly reduced by the BOX layer which eliminates the floor area of the n-well to p− junction which would act as the major part of the base-collector junction of the parasitic bipolar devices. Additionally, BOX layer 770 limits the sensitive volume, and therefore the current transients should be correspondingly reduced over the bulk case. Vertical conductor 750 is efficient at collecting excess holes and controlling the p− potential.

Figure 8A:
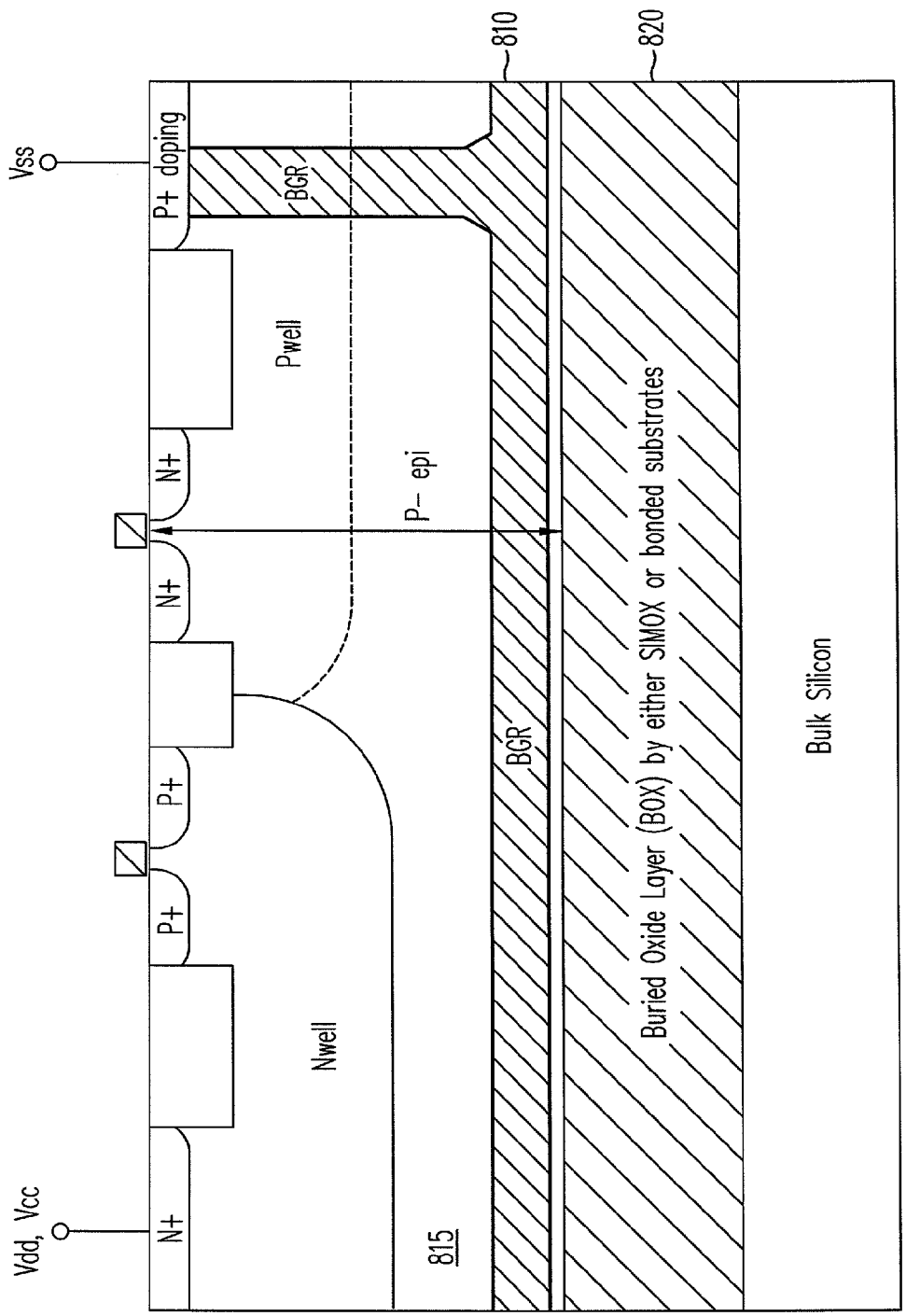
FIGS. 8A-8B illustrate still other embodiments of the present invention.
Figure 8B:
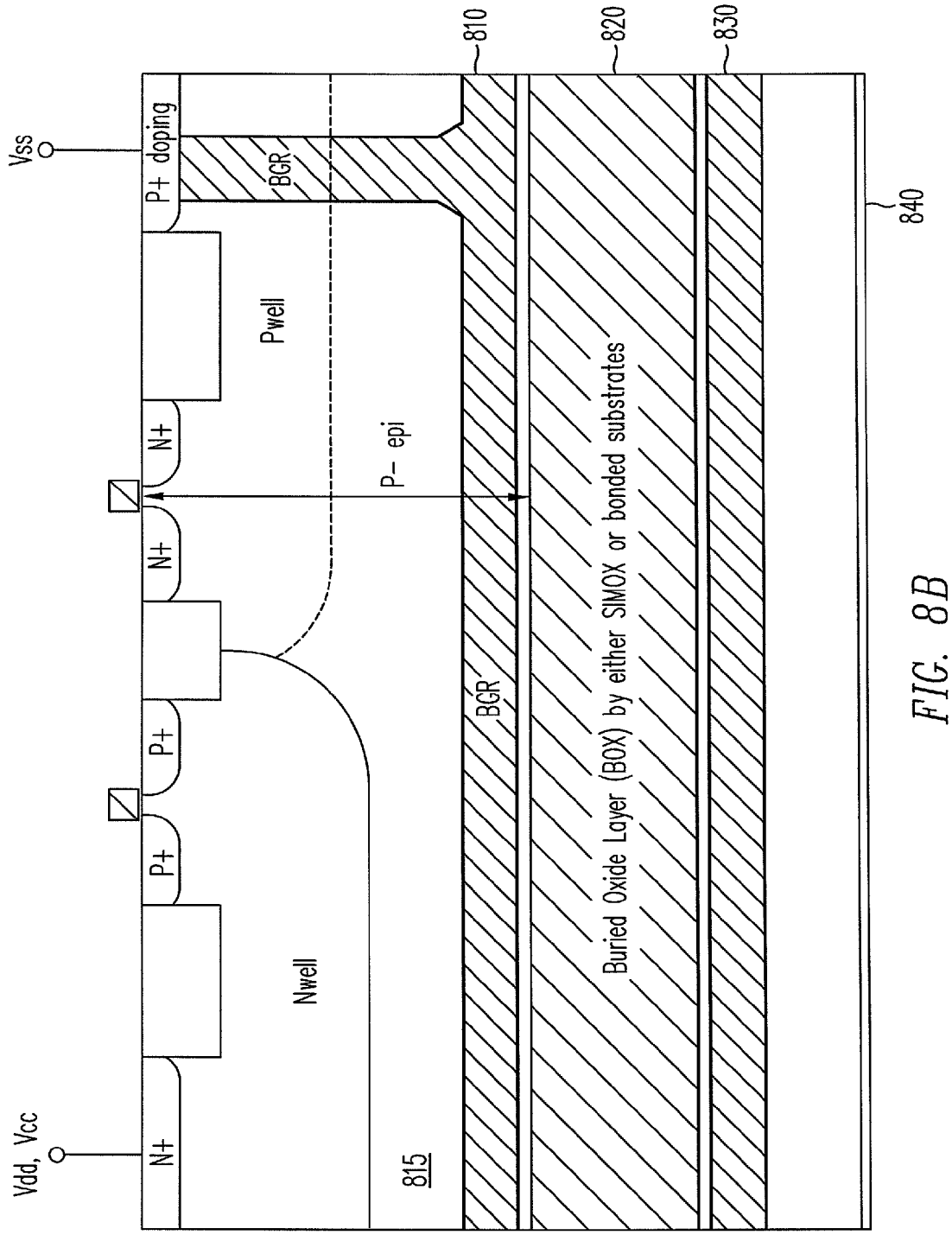

FIGS. 8A-8B illustrate still other embodiments and variations of SOI devices. As shown in FIG. 8A, BGR structure 800 and a corresponding CMOS inverter have the same basic structure as that illustrated in FIG. 3. Note that in this example, as well as the example of FIG. 8B, the BGR structure can in general be formed using any of the structures/techniques described above. BGR structure 810 and its associated CMOS devices are formed in epitaxial layer 815. Buried oxide layer 820 is formed in (e.g., using a SIMOX process) or on (e.g., using a bonded wafer process) the bulk silicon wafer. Thus, BGR devices can further take advantage of the beneficial properties of SOI wafers including: reduced parasitic capacitance, additional SEU immunity, and in some cases simplified processing. Another variation, shown in FIG. 8B, includes and additional HDBL 830 below BOX layer 820. Current collected in this HDBL can be conducted through backside contact 840 and to a suitable device package pin, e.g., a ground pin. In other embodiments, there is no backside contact to HDBL 830. Since typical recovery times are extremely short, on the order of 1 ns or less, displacement current through BOX layer 820 may be significant. HDBL 830 should serve to significantly reduce any current or voltage transients from carriers below the BOX throughout the device, thereby reducing the impact of the transient event. In still other embodiments, an HDBL can be used beneath the BOX layer and without a BGR structure above the BOX layer.

Note that typical device implementations will keep the insulator layer safely away from all vertical trenches and depletion regions. This ensures that there will be no contribution to TID leakage along the silicon-insulator interface (the back-channel). The remaining potential TID leakage path then is through the silicon-shallow trench interface at the "width" ends of the n-channel device. This path can be blocked with the PID as described above.

The use of HDBL and BGR structures in SOI wafers can be readily integrated into various commercial fabrication processes. For example, an SOI substrate with a thick silicon film allows typical bulk transistors to be manufactured using SOI without changes to SPICE compact models or ground rules. Simulations comparing bulk and SOI/vertical-conductor transistors show that transistor IV plots for the two drain biases are nearly identical. As compared to the device illustrated in FIG. 3, the device of FIG. 7 should need fewer ion implantation steps, lower maximum implant energy, and thinner photoresist requirements.

The various devices and techniques described in the present application create low ohmic regions contiguous and/or connected to isolation doping regions which stand separated from the transistor doping regions. These structures can be integrated into any existing CMOS twin well and some triple well isolation structures with no adverse impact to existing structures, thus enabling the improvements necessary to provide robust isolation for both conventional circuit noise initiated latch-up and single event latch-up. Moreover, the BGR, HDBL, and vertical conductor structures and techniques can be used to prevent latch-up in both radiation-hardened and conventional microelectronic circuits. They can be further combined with PID structures and techniques to provide TID protection to the device. All of these structures and techniques can also be implemented on a variety of different process variations, such as epitaxial silicon on bulk silicon (either with or without a heavily doped substrate), SOI, SOS, and the like.

The BGR, HDBL, and vertical conductor structures and techniques can also be used to reduce or eliminate both single-event upset (SEU) and single-event transient (SET) events. SEU and SET can be caused by a high-energy particle, e.g., a single heavy ion or nuclear particle such as a neutron or alpha particle, passing through a critical node in an IC. Immediately after being struck by such a particle electrons and holes will be separated from the silicon lattice as a function of the particle's energy which is expressed as the linear energy transfer (LET Mev/mg-cm) of the particular particle. If the charge deposited and ultimately collected as free electrons and holes is greater than the critical charge of a memory cell or some other state-related device, a single-event upset can occur. The susceptibility of ICs to single-event upsets typically depends on the amount of critical charge required to "flip" a bit and the probability that a particle with a LET large enough to deposit that critical charge will strike a sensitive node. The production of large numbers of electron/hole charges also creates a potential dipole within the particle track passing through the silicon material. The electrons and holes travel in opposite directions and tend to segregate in the presence of an electrostatic field. Some electrons and holes can recombine in the lattice via SRH and Auger mechanisms. However, as a result of their higher mobility, electrons are quickly collected at the positive terminals, whereas the net concentration of holes, which have lower mobility and remain with the silicon body as static charge while unrecombined because of depleted electrons. The net positive charges cause the local potential of the p− substrate to increase in voltage to a positive value and continues to influence the local potential of the p− substrate positively for several nano-seconds after the high energy particle strike. As a result of the potential upset within the p− substrate, other unstruck diodes are now activated which creates secondary currents and enhances the initial upset more significantly, an effect often referred to as single event transient (SET). While soft error results in data corruption, it is not destructive to the physical circuit.

Since CMOS logic typically uses inverter gates and cross-coupled logic gates to store binary bits in any digital circuit, the aforementioned devices and techniques will prove useful in reducing SEU and SET. The disclosed structures serve a similar role with regards to soft error as in the latch-up isolation. In both cases the structures effectively sink excess positive charge generated by the upset event, while maintaining node potential, and limiting the transient voltage swing and duration following an SEU, SEL, or SET event.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage (or for some circuit technologies, a current) of a node within the circuit. Such shorthand phrases for describing circuit operation used herein are more efficient to communicate details of circuit operation, particularly because the schematic diagrams in the figures clearly associate various signal names with the corresponding circuit blocks and nodes.

An insulated gate field effect transistor (IGFET) may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical (which is typically not the case for bipolar transistors). For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOS and MOSFET should not only be interpreted to literally specify a metal gate FET having an oxide dielectric.

Regarding power supplies, a single positive power supply voltage (e.g., a 1.5 volt power supply) used to power a circuit is frequently named the "$V_{DD}$" power supply. In an integrated circuit, transistors and other circuit elements are actually connected to a $V_{DD}$ terminal or a $V_{DD}$ node, which is then operably connected to the $V_{DD}$ power supply. The colloquial use of phrases such as "tied to $V_{DD}$" or "connected to $V_{DD}$" is understood to mean "connected to the $V_{DD}$ node", which is typically then operably connected to actually receive the $V_{DD}$ power supply voltage during use of the integrated circuit. The reference voltage for such a single power supply circuit is frequently called "$V_{SS}$." Transistors and other circuit elements are actually connected to a $V_{SS}$ terminal or a $V_{SS}$ node, which is then operably connected to the $V_{SS}$ power supply during use of the integrated circuit. Frequently the $V_{SS}$ terminal is connected to a ground reference potential, or just "ground." Generalizing somewhat, the first power supply terminal is frequently named "$V_{DD}$", and the second power supply terminal is frequently named "$V_{SS}$." Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative $V_{DD}$ power supply, while old NMOS circuits used a positive $V_{DD}$ power supply. Common usage, however, frequently ignores this legacy and uses $V_{DD}$ for the more positive supply voltage and VSS for the more negative (or ground) supply voltage unless, of course, defined otherwise. Describing a circuit as functioning with a "$V_{DD}$ supply" and "ground" does not necessarily mean the circuit cannot function using other power supply potentials. Other common power supply terminal names are "$V_{CC}$" (a historical term from bipolar circuits and frequently synonymous with a +5 volt power supply voltage, even when used with MOS transistors which lack collector terminals) and "GND" or just "ground."

Moreover, implementation of the disclosed devices and techniques is not limited by CMOS technology, and thus implementations can utilize NMOS, PMOS, and various bipolar or other semiconductor fabrication technologies. While the disclosed devices and techniques have been described in light of the embodiments discussed above, one skilled in the art will also recognize that certain substitutions may be easily made in the circuits without departing from the teachings of this disclosure. Also, many circuits using NMOS transistors may be implemented using PMOS transistors instead, as is well known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, other combinations of output stages are possible to achieve similar functionality.

What is claimed is:

1. A method comprising:
providing a wafer having an impurity concentration and having a resistivity no greater than 20 ohm-centimeters, and having a top surface and a bottom surface;
forming a first plurality of wells having a first conductivity type;
forming a second plurality of wells having a second conductivity type opposite the first conductivity type;
implanting ions into the wafer to form a substantially continuous buried layer in the wafer, the buried layer comprising the first conductivity type and a buried layer impurity concentration greater than the wafer impurity concentration, said buried layer extending substantially continuously beneath and vertically spaced apart from both the first and second plurality of wells;
forming a first plurality of transistors proximate to the top surface of the wafer, said first plurality of transistors including a respective transistor disposed in each of the first plurality of wells;
forming a second plurality of transistors proximate to the top surface of the wafer, said second plurality of transistors including a respective transistor disposed in each of the second plurality of wells;
forming a conductive layer on the bottom surface of the wafer, to provide a vertical conductive path between the buried layer and the conductive layer.

2. The method of claim 1 wherein the wafer is a bulk silicon wafer having the first conductivity type and having a substrate resistivity no greater than 20 ohm-centimeters.

3. The method of claim 1 wherein the wafer comprises:
a substrate material; and
an epitaxial layer of semiconductor material formed on the substrate material.

4. The method of claim 3 wherein the implanting ions further comprises implanting ions at an energy and angle with respect to the wafer to locate the buried layer one of:
within the substrate material;
within the epitaxial layer of semiconductor material; and
partially in each of the substrate material and the epitaxial layer of semiconductor material.

5. The method of claim 1 wherein the forming the conductive layer further comprises one or more of:
depositing a metal layer using chemical vapor deposition;
electroplating a metal layer; or
sputtering a metal layer.

6. The method of claim 1 wherein the forming the conductive layer further comprises:
depositing a plurality of metal layers on the bottom surface of the wafer.

7. The method of claim 1 further comprising:
reducing the thickness of the wafer using one or more of mechanical grinding, chemical mechanical polishing, wet etching, or dry etching.

8. The method of claim 1 wherein at least one of forming the first plurality of transistors and forming the second plurality of transistors further comprises:
forming a source region having a first width;
forming a drain region having a second width; and
forming a channel region located between the source region and the drain region, wherein the channel region has a channel length and a third width greater than each of the first width and the second width thereby forming at least one channel extension, and wherein the at least one channel extension provides a net channel edge length between the source region and the drain region that is greater than the channel length.

9. The method of claim 8 wherein the forming the channel region further comprises:
implanting ions to form a channel extension impurity region along the length of the at least one channel extension and spaced apart from the source and drain regions.

10. The method of claim 9 wherein the channel extension impurity region extends to a depth greater than a depth of at least one of the source region and the drain region.

11. The method of claim 9 wherein the channel extension impurity region has an impurity concentration greater than the wafer impurity concentration.

12. The method of claim 9 wherein the channel extension impurity region has a conductivity type opposite that surrounding the channel extension impurity region.

13. The method of claim 1 wherein the conductive layer is substantially continuous along the bottom surface of the wafer.

14. The method of claim 1 wherein the conductive layer is patterned along the bottom surface of the wafer.

15. The method of claim 3 wherein the epitaxial layer of semiconductor material has a resistivity no greater than 20 ohm-centimeters.

16. The method of claim 1 wherein the buried layer is sufficiently beneath the second plurality of wells so as to substantially avoid counter-doping the second plurality of wells.

* * * * *